United States Patent [19]

Geuer et al.

[11] Patent Number: 4,833,459

[45] Date of Patent: May 23, 1989

[54] CIRCUIT ARRANGEMENT FOR CONTINUALLY MONITORING THE QUALITY OF A MULTICELL BATTERY

[76] Inventors: Wolfgang Geuer, Revalsberger Strasse 45, 5102 Würselen; Peter Lürkens, Alexianergraben 21; Hans P. Schöner, Jahnplatz 3, both of 5100 Aachen, all of Fed. Rep. of Germany

[21] Appl. No.: 148,890

[22] Filed: Jan. 27, 1988

[30] Foreign Application Priority Data

Jan. 27, 1987 [DE] Fed. Rep. of Germany ....... 3702591

[51] Int. Cl.[4] .............................................. G08B 21/00
[52] U.S. Cl. ...................................... 340/636; 320/48
[58] Field of Search .......... 320/48; 340/636, 505–508, 340/825.05, 825.52; 324/426

[56] References Cited

U.S. PATENT DOCUMENTS

| | | | |
|---|---|---|---|
| 4,495,617 | 1/1985 | Ampulski | 340/828.05 |
| 4,517,644 | 5/1985 | Hamada | 340/825.05 |
| 4,542,496 | 9/1985 | Takeyama | 340/825.05 |
| 4,581,770 | 4/1986 | Haworth | 340/825.05 |
| 4,612,534 | 9/1986 | Bühler | 340/505 |
| 4,636,649 | 1/1987 | Kimura | 340/505 |
| 4,703,451 | 10/1987 | Calabrese | 340/825.52 |
| 4,725,836 | 2/1988 | Guidos | 340/825.52 |

Primary Examiner—Reinhard J. Eisenzopf
Assistant Examiner—Jose M. Solis
Attorney, Agent, or Firm—Shlesinger, Fitzsimmons & Shlesinger

[57] ABSTRACT

The quality of a particular physical or chemical parameter which exists at the cells of a multicell battery, such as for example, the voltage, current or temperature parameter at each cell, is continually monitored by a circuit arrangement which includes a separate measuring circuit for each cell. Each measuring circuit receives at its input, a signal representative of the value of the quality of a particular parameter, and produces at its output an electrical signal the length of which is proportional to the value of the signal at its input. The outputs of the measuring circuits are connected to a measuring analyzer circuit containing a controller which generates a starting signal that is applied to the measuring circuits to enable or actuate them one after the other, so that the outputs of the measuring circuits are in turn successively applied to the input of the analyzer circuit, which includes a display that provides an indication of the quality of the parameters which are being monitored.

9 Claims, 5 Drawing Sheets

CIRCUIT ARRANGEMENT FOR CONTINUALLY MONITORING THE QUALITY OF A MULTICELL BATTERY

The present invention is directed to a circuit arrangement as specified in the preamble of claim 1.

The measure for this monitoring process in the case of series-connected cells primarily shall be the comparison of the individual cell voltages or the comparison of individual groups of cells with one another and with stored reference values. In the case of parallel-connected cells it is possible instead thereof, or in addition thereto, to analyze the cell current for monitoring purposes. Either information permits an inference on the internal resistance of the cells which in its turn makes it possible to obtain significant evidence on the condition of the individual cells. Furthermore, the temperature of the individual cells is of great importance, for instance, for optimizing the charging procedure.

Circuit arrangements and methods of this type are important, for example, for the development of storage batteries with a view to optimizing the service life, or for the simple remote interrogation of the quality condition of large battery systems for various applications. e.g. in the case of emergency sets, since it is especially with extremely stressed batteries that the performance of the weakest cell should determine the handling of the entire storage battery.

Until recently it has been common practice to pass the voltages from the individual cells on single electrical cables to a central measured-value logger for evaluation. The parallel installation of measuring cables having high potential differences is accompanied by risks, all the more as these cables must be installed in an aggressive and hazardous environment. Moreover, the large number of cables to be installed incurs great expense and a certain susceptibility to faults caused by electric and magnetic fields, which can be very strong in the vicinity of storage batteries.

It is the object of the present invention to design a circuit arrangement as specified in the preamble of claim 1 in such a way that it is possible by a simple design to detect the voltage and/or other continually varying physical or chemical parameters such as current, temperature of every single cell or of groups of cells of multicell batteries and to permit on the basis thereof a simple and reliable continual monitoring of the quality of a multicell battery. In particular, the installation of electrical leads shall be minimized.

In accordance with the present invention the specified object is solved by the features set out in the characterizing portion of claim 1. Further embodiments of the invention shall be protected by the subclaims.

Embodiments of the invention are illustrated in the drawing, in which.

Figure 1:
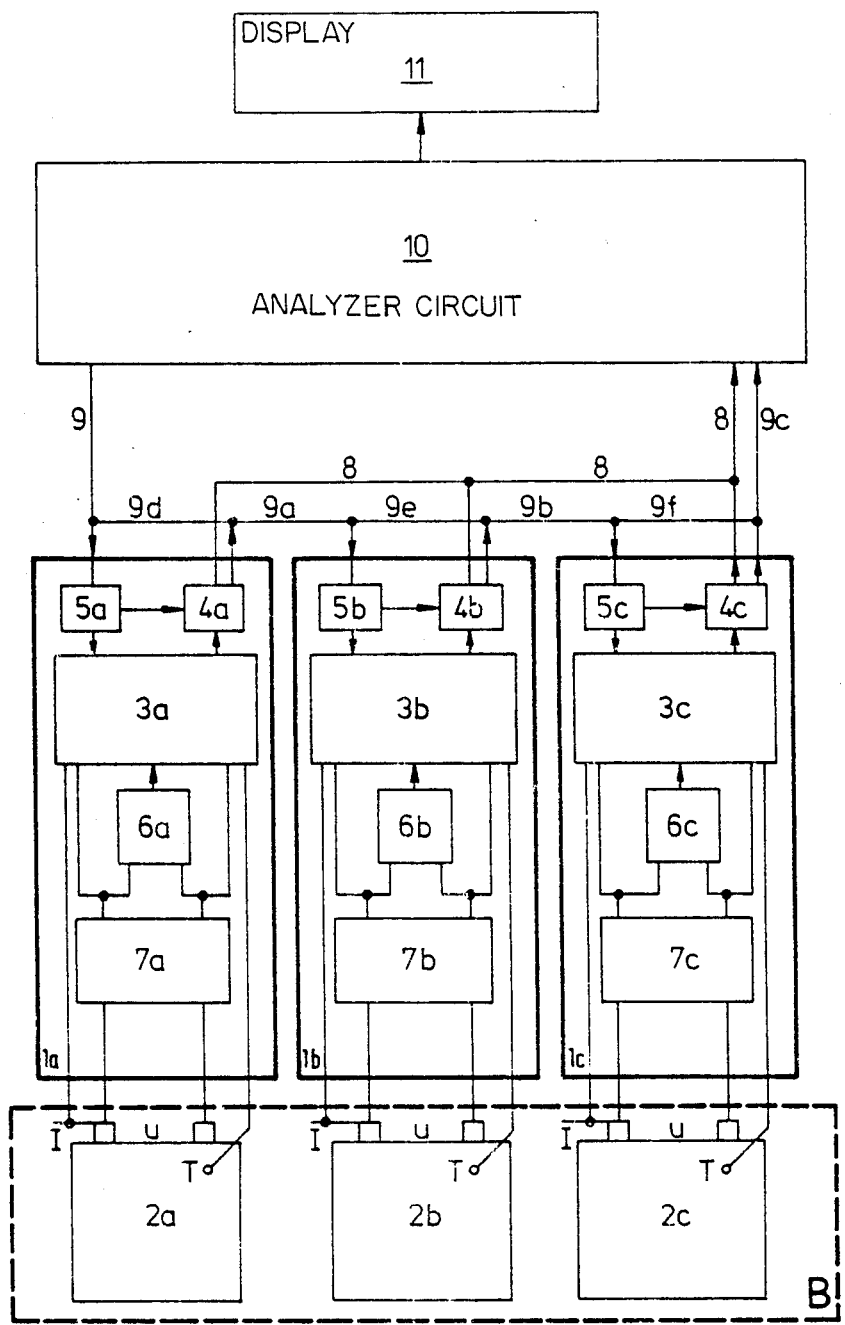
FIG. 1 is an overall schematic diagram of the circuit arrangement.

In the drawing, identical parts have been give the same reference characters. The schematic drawing of FIG. 1 shows as an example three cells 2a, 2b and 2c in side-by-side relationship. The number of cells can be varied as desired. Moreover, it is also possible to combine instead of a single cell a respective group of cells and to connect it to a common measuring circuit.

As shown in FIG. 1, each of the cells 2a, 2b and 2c has a measuring circuit generally referenced 1a, 1b and 1c connected thereto. The cell terminals are connected to voltage adapters 7a, 7b and 7c, respectively. Two output terminals from each voltage adapter are connected to power supplies 6a, 6b and 6c, respectively, and in parallel to the inputs of measuring transducers 3a, 3b and 3c. The output signals from these voltage adapters are proportionally reduced values of the terminal voltages across said voltage adapters. Such voltage adapters are necessary only for higher voltages of generally more than 12 V. Therefore they provide an expansion of the range of the measuring circuits. The power suplies 6a 6b and 6c supply power to the various measuring transducers 3a, 3b and 3c or optionally to coupling circuits 4a, 4b and 4c, which constitute the outputs of the measuring transducers 3a, 3b and 3c, and optionally to signal isolating circuits 5a, 5b and 5c which are connected between the control line 9, extending from an analyzer circuit 10, and the measuring transducers 3a, 3b and 3c. Depending on the type of coupling circuits 4a, 4b and 4c and the type of signal isolating circuits 5a, 5b and 5c used, such a power supply may or may not be necessary. For example, the optocouplers preferably used as coupling circuits 5a–5c will not require a power supply of their own.

A controller (not illustrated), which is provided in the analyzer circuit 10 in the embodiment of FIG. 1, delivers starting signals via a control line 9 to the signal isolating circuits 5a, 5b and 5c. In the illustrated embodiment, which shall initially be assumed as being of the type which is designed without the control line sections 9d, 9e, 9f, this control signal transmission takes place from one measuring circuit to the next one (i.e., successively from 1a through 1c), and from the last measuring circuit (1c) the control line 9c returns a signal to the controller provided in the analyzer circuit 10. For example, the output signal from the signal isolating circuit 5a of the first measuring circuit 1a triggers the measuring transducer 3a to measure the instantly pesent measured values of selected battery parameters, for example the applied battery voltage, the current presently drawn from the battery, the temperature inside the battery, etc. The measuring transducer 3a converts the obtained measuring signals to corresponding voltage pulses having a duration which is proportional to the measured value. The coupling circuit 4a causes transfer of said voltage pulse to the common measuring line 8 leading to the common analyzer circuit 10. The trailing edge of this voltage pulse is transferred by the coupling circuit 4a via a partial control line 9a to the signal isolating circuit 5b of the next-following measuring circuit 1b where the measuring operation is triggered in a similar way. The trailing edge of the voltage pulse delivered by the corresponding coupling circuit 4b via a partial control line 9b in its turn triggers the signal isolating circuit 5c of the next-following measuring circuit 1c, etc.

When the control line sections 9d, 9e, 9f are also implemented, the transmission of measuring control signals to the individual measuring circuits 1a, 1b, 1c takes place via an address code allocated to each measuring circuit.

The analyzer circuit 10 delivers a selected parameter of a signal which provides information about the instantaneous quality condition of a storage battery. This signal may be transmitted to a display means 11 whence it may also be transmitted further, if desired.

In the embodiment of FIG. 1 a storage battery B having three single cells 2a, 2b, 2c is illustrated. Instead thereof, it is also possible to employ any desired larger number of cells. For example, a storage battery of 220 V requires 110 cells of 2 V each.

Figure 2:
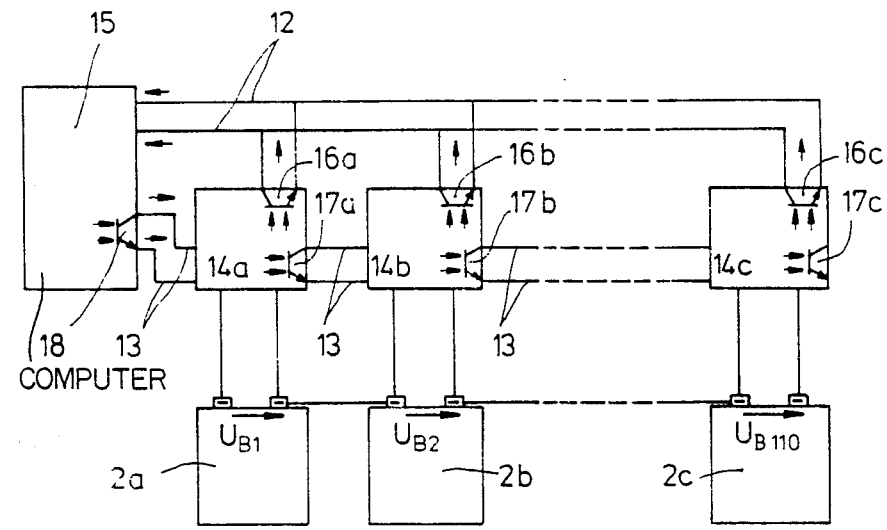
FIG. 2 is a schematic view of a special embodiment employing optocouplers.

FIG. 2 is a schematic diagram of an embodiment in which a two-wire measuring line 12 is provided which is coupled to each measuring circuit 14a, 14b, 14c via a respective measuring signal optocoupler 16a, 16b, 16c. The individual measuring signals are supplied to the analyzer circuit which is implemented as a computer 15. Within the computer 15 the controller is provided, and which via a first control signal optocoupler 18 and via a first two-wire control line 13a, delivers a trigger control output to the first measuring circuit 14a for performing measurement of the measuring values currently present at the associated first cell 2a and transmitting the same via the first optocoupler 16a to the common measuring line 12. As mentioned above, the measuring signal preferably is a pulse of a duration which is proportional to the measured value. The trailing edge of the measuring signal is simultaneously used to perform the measuring operation for the associated second cell 2b via a first control signal optocoupler 17a provided in the first measuring circuit 14a and a second control line 13b connected to the second measuring circuit 14b, etc.

Figure 3:
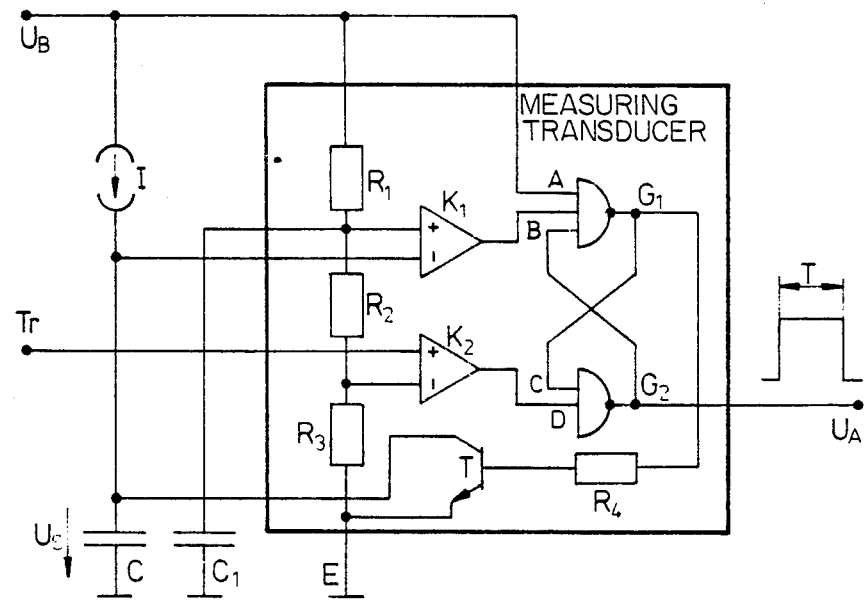
FIG. 3 is the circuit diagram of a usual measuring transducer.

FIG. 3 shiows a measuring transducer circuit which may be used in the embodiment according to FIG. 1 and FIG. 2 for converting the voltage $U_B$ across the individual cells to a pulse of a duration which is proportional to $U_B$. This is a preferred embodiment for a measuring transducer 3a, 3b, 3c according to FIG. 1 or 14a, 14b, 14c according to the embodiment of FIG. 2, respectively.

The voltage $U_B$ across the cell, the opposite pole of which is connected to ground at E, is applied via a first resistor $R_1$ to the positive input of a first operational amplifier $K_1$ whereas the negative input of said amplifier is connected to the same positive input via a constant-current source I.

The positive input of a second operational amplifier $K_2$ is connected to a trigger input Tr whereas the negative input of said second operational amplifier $K_2$ is connected via a second resistor $R_2$ to the positive input of the first operational amplifier $K_1$. The negative input of the second operational amplifier $K_2$ is connected via a third resistor $R_3$ to the emitter terminal of a transistor T. The collector terminal of the transistor T is connected to the negative input of the first operational amplifier $K_1$. Both the negative and the positive input of the first operational amplifier $K_1$ are connected to ground via capacitors C and $C_1$, respectively. The base of the transistor T is connected via a fourth resistor $R_4$ to the output of a first inverting AND-circuit $G_1$. A first input A of the first inverting AND-circuit $G_1$ is connected to the positive terminal of the cell, and a second input B of the first inverting AND-circuit $G_1$ is connected to the output of the first operational amplifier $K_1$.

The output of the first inverting AND-circuit $G_1$ is connected to a first input C of a second inverting AND-circuit $G_2$, whereas a second input D of the second inverting AND-circuit $G_2$ is connected to the output of the second operational amplifier $K_2$. The output of the second inverting AND-circuit $G_2$ supplies the desired output signal from the measuring transducer as a square-wave pulse $U_A$ of the period T of which is proportional to the voltage $U_B$ across the cell.

Figure 4:
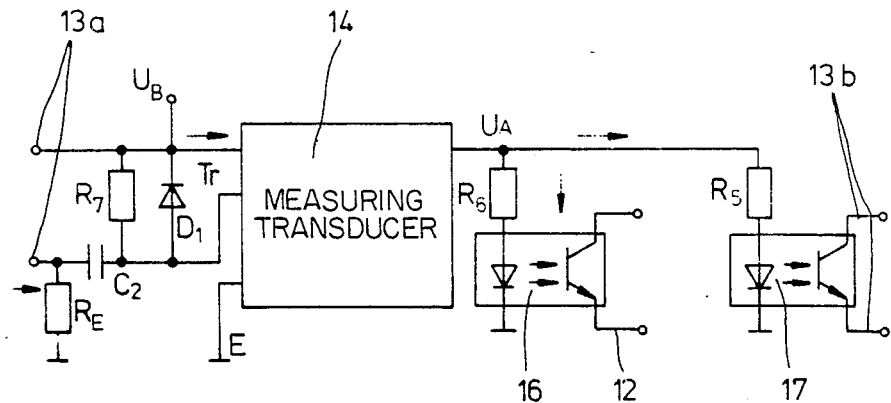
FIG. 4 is the overall diagram of a measuring circuit according to FIG. 1.

FIG. 4 illustrates typical signal isolating and coupling circuits used in the allocation of the measuring transducer 14 within the measuring circuit 1. When the control trigger signal from the control line 13a is supplied to the measuring transducer 14, the output signal from the measuring transducer 14 is supplied via a reistor $R_6$ to the light emitting diode of a measuring signal optocoupler 16 as the voltage pulse $U_A$ proportional to the measured value of $U_B$, and the trailing edge of said measuring signal $U_A$ is used for triggering the measuring operation in the next-following cell by delivering the measuring signal via a series resistor $R_5$ to a control signal optocoupler 17. The optocoupler 17 is connected via a second control line 13b to the measuring circuit and the measuring transducer of the next-following cell (not illustrated).

The supply of the measurement starting signal, which is produced by a controller in the computer or by the measuring transducer of the preceding cell (not illustrated), to the measuring transducer 14 is effected via a differential circuit composed of a ground resistor $R_E$, a capacitor $C_2$, a resistor $R_7$ and a diode $D_1$ for converting the trailing edge of the control pulse delivered via control line 13a to a trigger pulse Tr.

Figure 5:
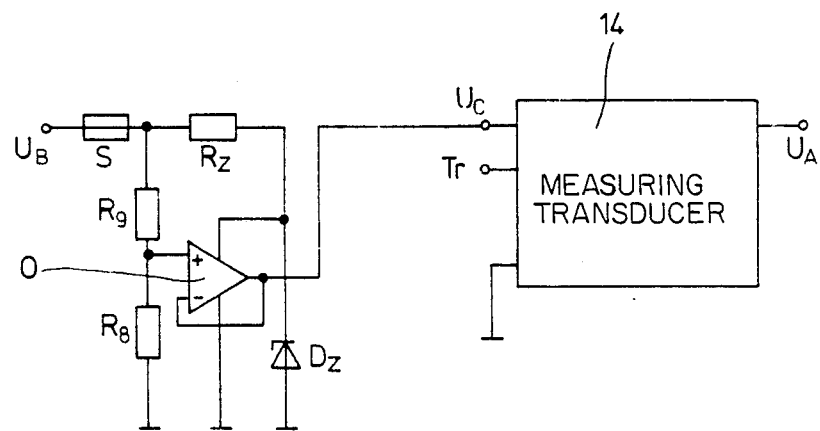
FIG. 5 is a matching circuit according to FIG. 1 for use in a circuit arrangement in which a measuring circuit for plural cells is used.

FIG. 5 shows a matching circuit according to FIG. 1 for expanding the range of measurement in case of plural cells being connected to a single measuring circuit, in which case correspondingly higher measured values will result especially as regards the battery voltage and the battery current. The core of the voltage adapter circuit of FIG. 5 is an operational amplifier O the positive input + of which is connected via a fuse S and a first resistor $R_9$ to the terminal voltage of the storage battery, while at the same time the positive input is connected to ground via a second series resistor $R_8$. The negative input of the operational amplifier O is connected to the output thereof, and the output of operational amplifier O therefore constitutes a loadable voltage source $U_C$ proportional to the terminal voltage $U_B$.

The resistor $R_Z$ and the diode $D_Z$ are used to provide the supply voltage for the operational amplifier.

The output of the operational amplifier O is connected as the voltage signal $U_C$ to the measuring transducer 14 and delivers the output signal $U_A$ as a square-wave pulse of predetermined duration which is proportional to the measured value.

Figure 6:
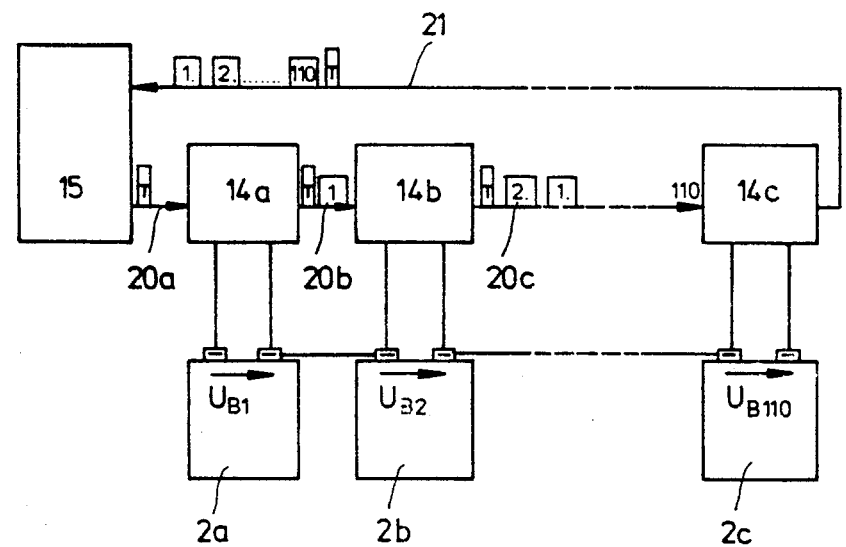
FIG. 6 is a diagram of FIG. 2, in which control line and measuring line coincide.

FIG. 6 illustrates the basic principle of the overall measuring arrangement illustrated in FIG. 2, wherein identical or corresponding parts have been provided with the same reference characters. The essential difference resides in the connection of the control line and the measuring line. The common analyzing circuit 15 implemented as a computer comprises the common controller (not illustrated) and transmits via a first control line 20a a starting pulse to the first measuring circuit 14a for triggering the measuring operation of the first cell 2a. Both the received measuring signal and the control signal for triggering the measurement in the next-following cell are delivered via a common combined control and measuring line 20b to the second measuring circuit 14b, etc. The last measuring circuit 14c is connected via a common measuring line 21 to the analyzing circuit in the form of the computer 15. In this way all measuring operations of a major system can be performed in a single line. In the prevailing aggressive atmosphere this is a particular advantage.

Figure 7:
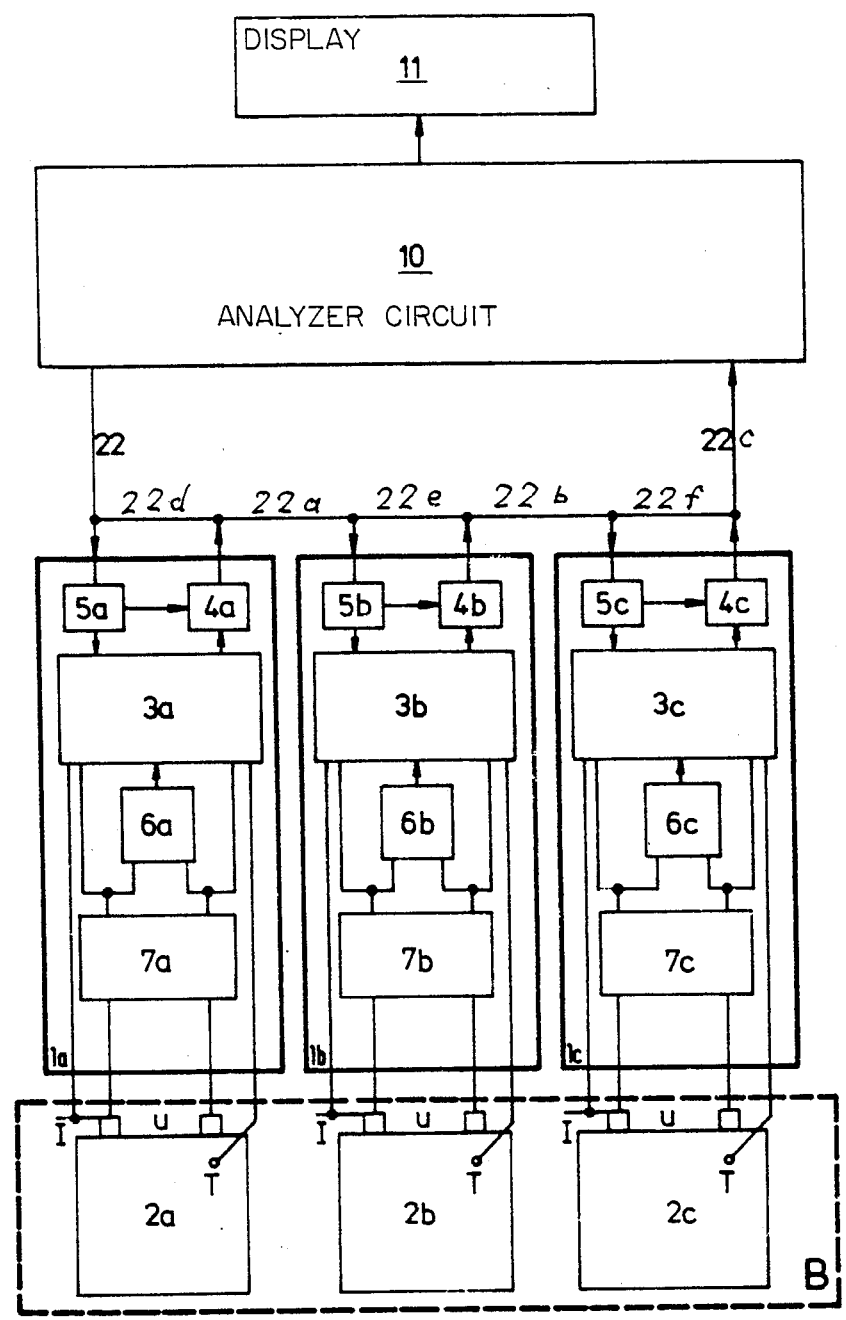
FIG. 7 is a special case of the overall diagram shown in FIG. 1, in which a single control line is provided which at the same time constitutes the common measuring line.

FIG. 7 shows an arrangement which basically corresponds to that shown in FIG. 1 or, respectively, also corresponds to the arrangements of FIGS. 2 and 6. The difference resides in a single, substantially ring-like control and measuring line 22, 22c, which starts from the controller provided in the analyzer circuit 10 and returns thereto. The individual measuring circuits 1a, 1b and 1c are energized via the associated signal isolating circuits 5a, 5b, 5c for measuring the associated cells. The obtained measuring signal is then successively delivered to the common line via the optocouplers 4a, 4b, 4c. The respective measuring signal simultaneously triggers the measurement of the next-following associated cell via the common line including the line sections 22d, 22a, 22e, 22b, 22f and the associated signal isolating element 5b, 5c, respectively.

In practical use, the circuit arrangement can be implemented, for example, such that different control signals are used to which only a respective special isolating circuit is responsive. This special control signal for each measuring circuit can be provided, for instance, either direct in the controller within the analyzer circuit 10 or as the output signal from the preceding coupling circuit 4a of the previously energized measuring circuit.

What is claimed is:

1. A circuit arrangement for continually monitoring electrical signals indicative of the quality of selected physical or chemical parameters, such as the voltage, current or temperature, existing at the cells of a multicell battery, comprising a plurality of measuring circuits having inputs connected to said cells for detecting and measuring said electrical signals that are indicative of said selected parameters, said measuring circuits including means for producing output signals the respective lengths of which are proportional to the measured values of said electrical signals applied to the respective inputs of said measuring circuits, a signal analyzer circuit having therein a controller for generating a starting signal, means connecting the signal outputs of said measuring circuits to said signal analyzer circuit and including coupling circuits responsive to said starting signal to apply the signal outputs of said measuring circuits to said signal analyzer circuit, and display means connected to the output of said signal analyzer circuit and responsive to signals therefrom to provide a display representative of the quality of said selected parameters.

2. Circuit arrangement as claimed in claim 1, wherein said measuring circuits include means for detecting voltage at each of said cells in said battery, whereby the output signals of said measuring circuits are proportional to respective voltages appearing at said battery cell.

3. Circuit arrangement as claimed in claim 1, characterized in that optocouplers are used as said coupling circuits.

4. Circuit arrangement as claimed in claim 1, characterized in that a computer is used as said signal analyzer circuit.

5. Circuit arrangement as claimed in claim 1, characterized in that said connecting means further includes means for successively enabling energization of said measuring circuits and for successively transmitting the output signals thereof to said signal analyzing circuit.

6. Circuit arrangement as claimed in claim 1, characterized in that said measuring circuits are connected in a series, and said connecting means further includes means for applying said starting signal only to the input of the first measuring circuit, in said series thereof, and the inputs of succeeding measuring circuits in said series thereof being respectively connected only to the outputs of the next preceding measuring circuit, the last measuring circuit in said series thereof being connected to the input of said analyzer circuit.

7. Circuit arrangement as claimed in claim 1, characterized in that said connecting means further includes means for transmitting said control signal and the output signals of a series of said measuring circuits simultaneously and successively in one direction from one to the next measuring circuit in said series thereof, whereby the output signals of each measuring circuit are delivered cyclically and successively to said analyzer circuit, and wherein the end of a respective output signal of one measuring circuit provides a control signal to actuate the next-following measuring circuit.

8. Circuit arrangement as claimed in claim 1, characterized by the fact that said control signal is passed on from one of said measuring circuits in a series thereof to the next-following measuring circuit in said series.

9. Circuit arrangement as claimed in claim 1, characterized in that each measuring circuit comprises a transducer for respectively transmitting voltage pulse to an analyzer circuit, said voltage pulse having a duration which corresponds to the value of the measured parameter.

* * * * *